(12) United States Patent
Ishii et al.

(10) Patent No.: US 11,571,712 B2
(45) Date of Patent: Feb. 7, 2023

(54) VIBRATION PANEL AND ELECTRONIC APPARATUS

(71) Applicant: TAIYO YUDEN CO., LTD., Tokyo (JP)

(72) Inventors: Shigeo Ishii, Tokyo (JP); Fumihisa Ito, Tokyo (JP); Yukihiro Matsui, Tokyo (JP); Hiroshi Hamada, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 341 days.

(21) Appl. No.: 17/007,355

(22) Filed: Aug. 31, 2020

(65) Prior Publication Data

US 2021/0060611 A1    Mar. 4, 2021

(30) Foreign Application Priority Data

Aug. 29, 2019   (JP) .............................. JP2019-156552

(51) Int. Cl.
*B06B 1/06*      (2006.01)
*G08B 6/00*      (2006.01)
*H01L 41/047*    (2006.01)
*H01L 41/053*    (2006.01)
*H01L 41/09*     (2006.01)
*H01L 41/187*    (2006.01)
*H04R 17/00*     (2006.01)
*H01L 41/083*    (2006.01)

(52) U.S. Cl.
CPC .............. *B06B 1/0603* (2013.01); *G08B 6/00* (2013.01); *H01L 41/0475* (2013.01); *H01L 41/0477* (2013.01); *H01L 41/053* (2013.01); *H01L 41/083* (2013.01); *H01L 41/0926* (2013.01); *H01L 41/1871* (2013.01); *H01L 41/1876* (2013.01); *H04R 17/00* (2013.01); *H04R 2400/03* (2013.01)

(58) Field of Classification Search
CPC ........................... B06B 1/0603; H01L 41/053
See application file for complete search history.

(56) References Cited

U.S. PATENT DOCUMENTS

| 2012/0249459 | A1* | 10/2012 | Sashida | ................... G06F 3/041 |
| | | | | 345/173 |
| 2014/0346926 | A1* | 11/2014 | Choi | ................... H01L 41/0933 |
| | | | | 310/323.01 |

(Continued)

FOREIGN PATENT DOCUMENTS

JP        2012-203895 A     10/2012

*Primary Examiner* — Bryan P Gordon
(74) *Attorney, Agent, or Firm* — Chen Yoshimura LLP

(57) ABSTRACT

Provided is a vibration panel including an inner member, a first outer member, a second outer member, a piezoelectric actuator, an actuator bonding layer, and a filler. The inner member includes first and second main surfaces. The first outer member includes third and fourth main surfaces, the third main surface including a first region and a second region. The second outer member includes fifth and sixth main surfaces, the fifth main surface including a third region and a fourth region. The piezoelectric actuator causes vibration. The actuator bonding layer is disposed between the piezoelectric actuator and the second region and bonds the piezoelectric actuator to the second region. The filler fills a space between the second region and the fourth region and covers the piezoelectric actuator.

5 Claims, 13 Drawing Sheets

(56) References Cited

U.S. PATENT DOCUMENTS

| 2015/0236240 A1* | 8/2015 | Park | H01L 41/23 |
| | | | 29/25.35 |
| 2017/0218942 A1* | 8/2017 | Chen | F16K 99/0015 |
| 2018/0226564 A1* | 8/2018 | Itayama | H01L 41/27 |
| 2019/0067553 A1* | 2/2019 | Mou | H01L 41/0471 |

* cited by examiner

| Fixation state | Soft fixation | Medium-hard fixation | Hard fixation |
|---|---|---|---|
| Actuator bonding layer | Elastomer | Epoxy resin | Epoxy resin |
| Filler | Silicon | Silicon | Epoxy resin |
| Young's modulus | $1.88 \times 10^5 \text{N/mm}$ | 2.4 GPa | 2.4 GPa |

FIG.12

| Voltage(Vpp) | 25 | 30 | 40 | 50 | 60 |
|---|---|---|---|---|---|
| Soft fixation | 5.04 | 6.29 | 9.41 | 12.6 | 16.24 |
| Medium-hard fixation | 7.22 | 8.92 | 13.29 | 17.85 | 22.71 |
| Hard fixation | 2.48 | 3.34 | 4.95 | 7.13 | 8.57 |

| Voltage(Vpp) | 5 | 10 | 15 | 20 |
|---|---|---|---|---|
| Soft fixation | 1.14 | 1.87 | 2.76 | 3.45 |
| Medium-hard fixation | 3.62 | 4.94 | 6.83 | 8.51 |
| Hard fixation | 2.3 | 3.51 | 4.69 | 5.82 |

VIBRATION PANEL AND ELECTRONIC APPARATUS

BACKGROUND ART

The present disclosure relates to a vibration panel and an electronic apparatus that cause vibration by a piezoelectric actuator.

A vibration panel obtained by bonding a piezoelectric actuator that causes vibration by the inverse piezoelectric effect to a panel can be used for tactile presentation, force feed-back, pronunciation, and the like.

Various methods have been considered for a method of bonding the piezoelectric actuator to the panel.

For example, Japanese Patent Application Laid-open No. 2012-203895 (hereinafter, referred to as Patent Literature 1) has disclosed a vibration panel with a piezoelectric actuator bonded to a groove formed in the panel.

With this configuration, since the piezoelectric actuator is bonded to the groove, the piezoelectric actuator can be mounted on the panel without increasing the thickness of the vibration panel, and vibration can be efficiently transmitted to the panel.

SUMMARY OF THE INVENTION

However, it is difficult to perform machining for forming the groove in the panel in the configuration described in Patent Literature 1.

In addition, there is a fear that long-term use of the piezoelectric element leads to a decrease in IR due to humidity and to breaking of the electrical connection portion.

In view of the above-mentioned circumstances, it is desirable to provide a vibration panel and an electronic apparatus that are excellent in reliability and vibration efficiency.

According to an embodiment of the present disclosure, there is provided a vibration panel including an inner member, a first outer member, a second outer member, a piezoelectric actuator, an actuator bonding layer, and a filler.

The inner member has a plate-like shape, the inner member including a first main surface and a second main surface opposite to the first main surface.

The first outer member has a plate-like shape, the first outer member including a third main surface on a side of the inner member and a fourth main surface opposite to the third main surface, the third main surface including a first region and a second region, the first region facing the inner member and being bonded to the first main surface, the second region protruding from the inner member and being not bonded to the inner member.

The second outer member has a plate-like shape, the second outer member including a fifth main surface on a side of the inner member and a sixth main surface opposite to the fifth main surface, the fifth main surface including a third region and a fourth region, the third region facing the inner member and being bonded to the second main surface, the fourth region protruding from the inner member, being not bonded to the inner member, and facing the second region.

The piezoelectric actuator causes vibration by an inverse piezoelectric effect.

The actuator bonding layer is disposed between the piezoelectric actuator and the second region and bonds the piezoelectric actuator to the second region.

The filler fills a space between the second region and the fourth region and covers the piezoelectric actuator.

With this configuration, the vibration characteristics can be controlled by selecting the material of the bonding layer and the material of the filler in a manner that depends on a desired frequency, and higher vibration efficiency can be achieved.

In addition, since the periphery of the piezoelectric actuator is filled with the filler, an electrical connection portion to the piezoelectric actuator is protected, and the vibration panel reliability can be improved.

The actuator bonding layer may include a first resin material, and the filler may include a second resin material having a Young's modulus smaller than a Young's modulus of the first resin material.

The first resin material may be epoxy resin, and the second resin material may be silicon.

The first outer member and the second outer member may include glass.

According to an embodiment of the present disclosure, there is provided an electronic apparatus including a vibration panel.

The vibration panel includes an inner member having a plate-like shape, the inner member including a first main surface and a second main surface opposite to the first main surface, a first outer member having a plate-like shape, the first outer member including a third main surface on a side of the inner member and a fourth main surface opposite to the third main surface, the third main surface including a first region and a second region, the first region facing the inner member and being bonded to the first main surface, the second region protruding from the inner member and being not bonded to the inner member, a second outer member having a plate-like shape, the second outer member including a fifth main surface on a side of the inner member and a sixth main surface opposite to the fifth main surface, the fifth main surface including a third region and a fourth region, the third region facing the inner member and being bonded to the second main surface, the fourth region protruding from the inner member, being not bonded to the inner member, and facing the second region, a piezoelectric actuator that causes vibration by an inverse piezoelectric effect, an actuator bonding layer that is disposed between the piezoelectric actuator and the second region and bonds the piezoelectric actuator to the second region, and a filler that fills a space between the second region and the fourth region and covers the piezoelectric actuator.

As described above, in accordance with the present disclosure, it is possible to provide a vibration panel and an electronic apparatus that are excellent in reliability and vibration efficiency.

These and other objects, features and advantages of the present disclosure will become more apparent in light of the following detailed description of embodiments thereof, as illustrated in the accompanying drawings.

It is to be understood that both the foregoing general description and the following detailed description are exemplary and explanatory, and are intended to provide further explanation of the disclosure as claimed.

BRIEF DESCRIPTION OF THE DRAWINGS

FIG. 12 is a table showing the materials and the Young's moduli of actuator bonding layers and fillers of the vibration panel;

DETAILED DESCRIPTION OF THE EMBODIMENTS

A vibration panel according to an embodiment of the present disclosure will be described.

[Configuration of Vibration Panel]

Figure 1:
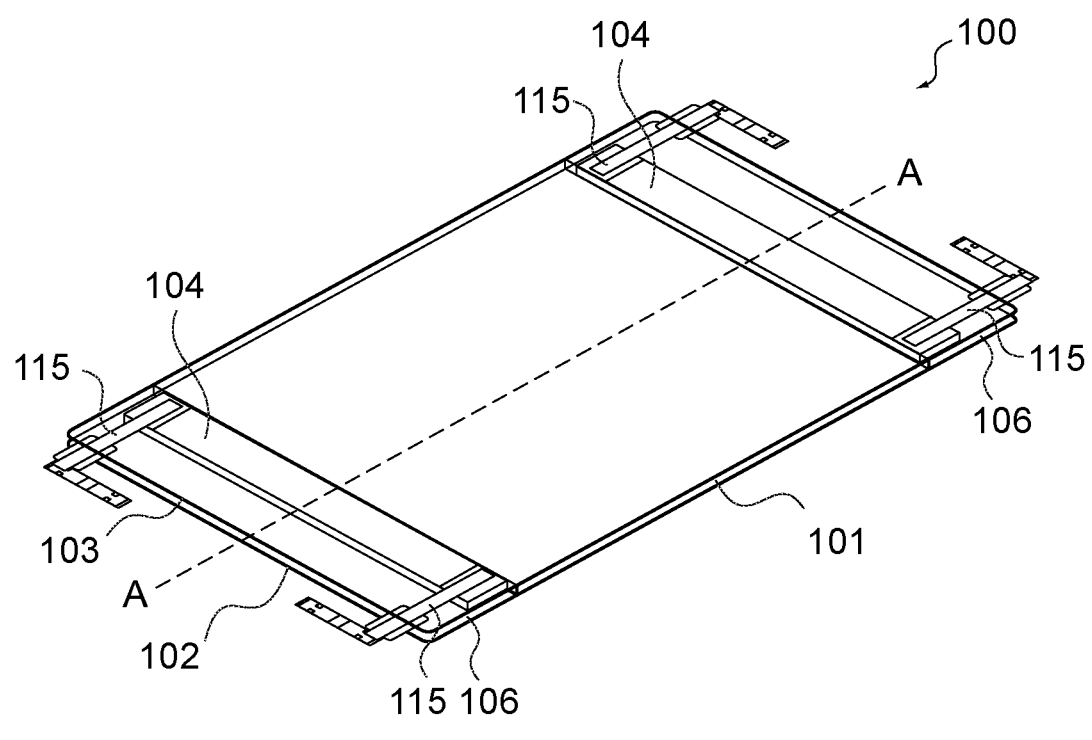
FIG. 1 is a perspective view of a vibration panel according to an embodiment of the present disclosure.
Figure 1:
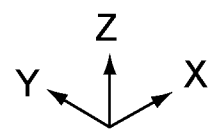
Figure 2:
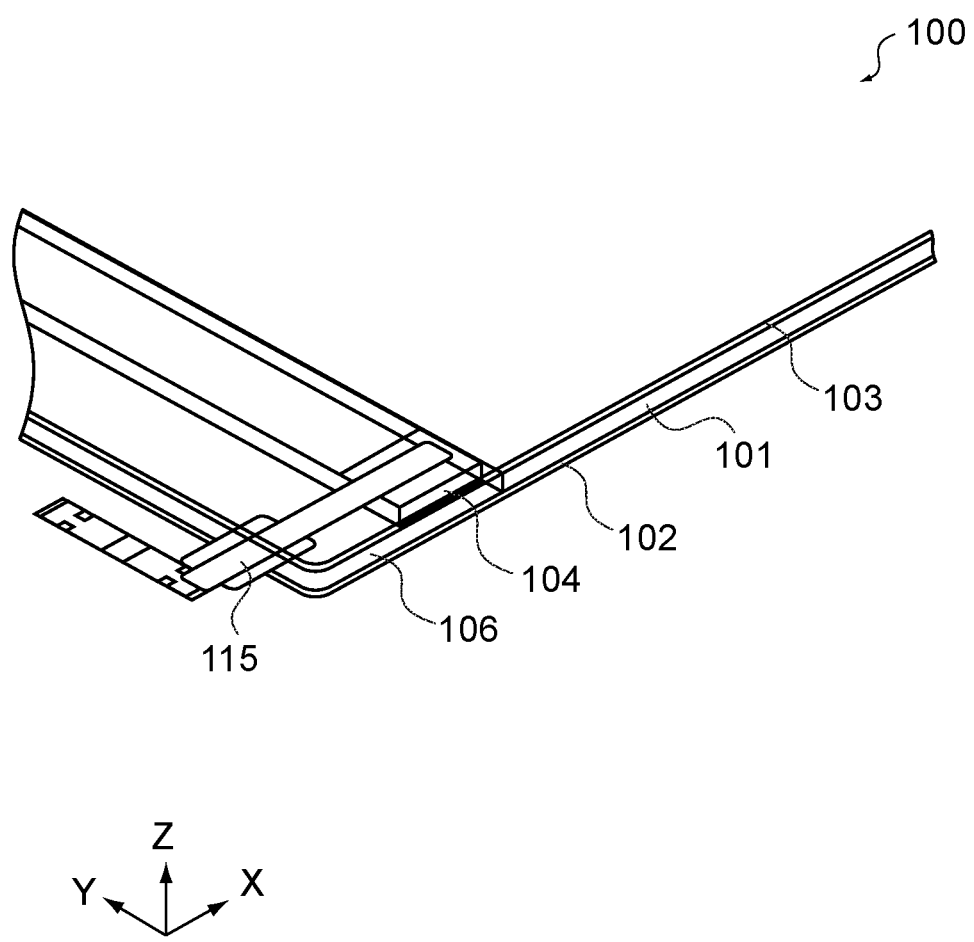
FIG. 2 is an enlarged, perspective view of the vibration panel.
Figure 3:
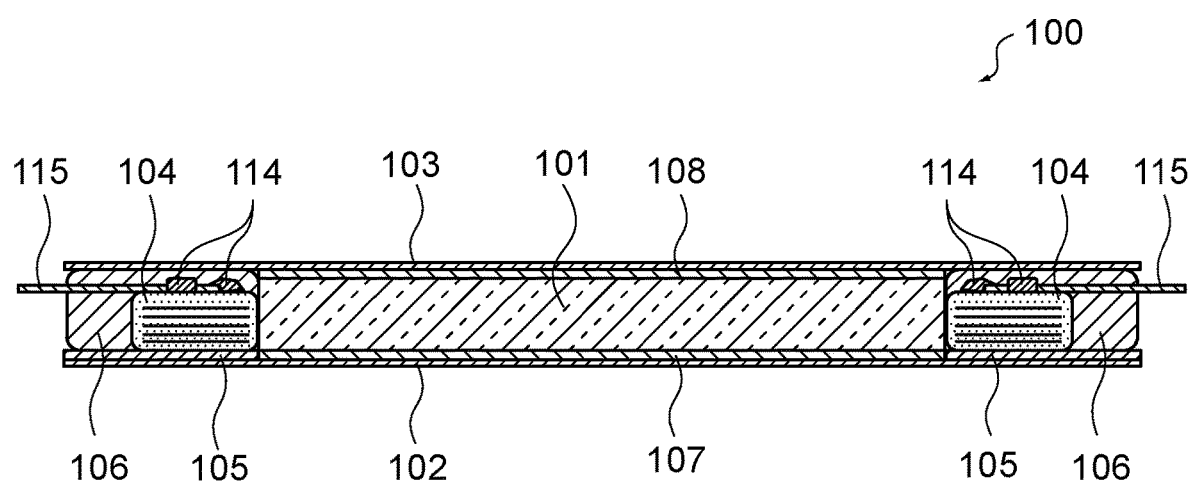
FIG. 3 is a cross-sectional view of the vibration panel.
Figure 4:
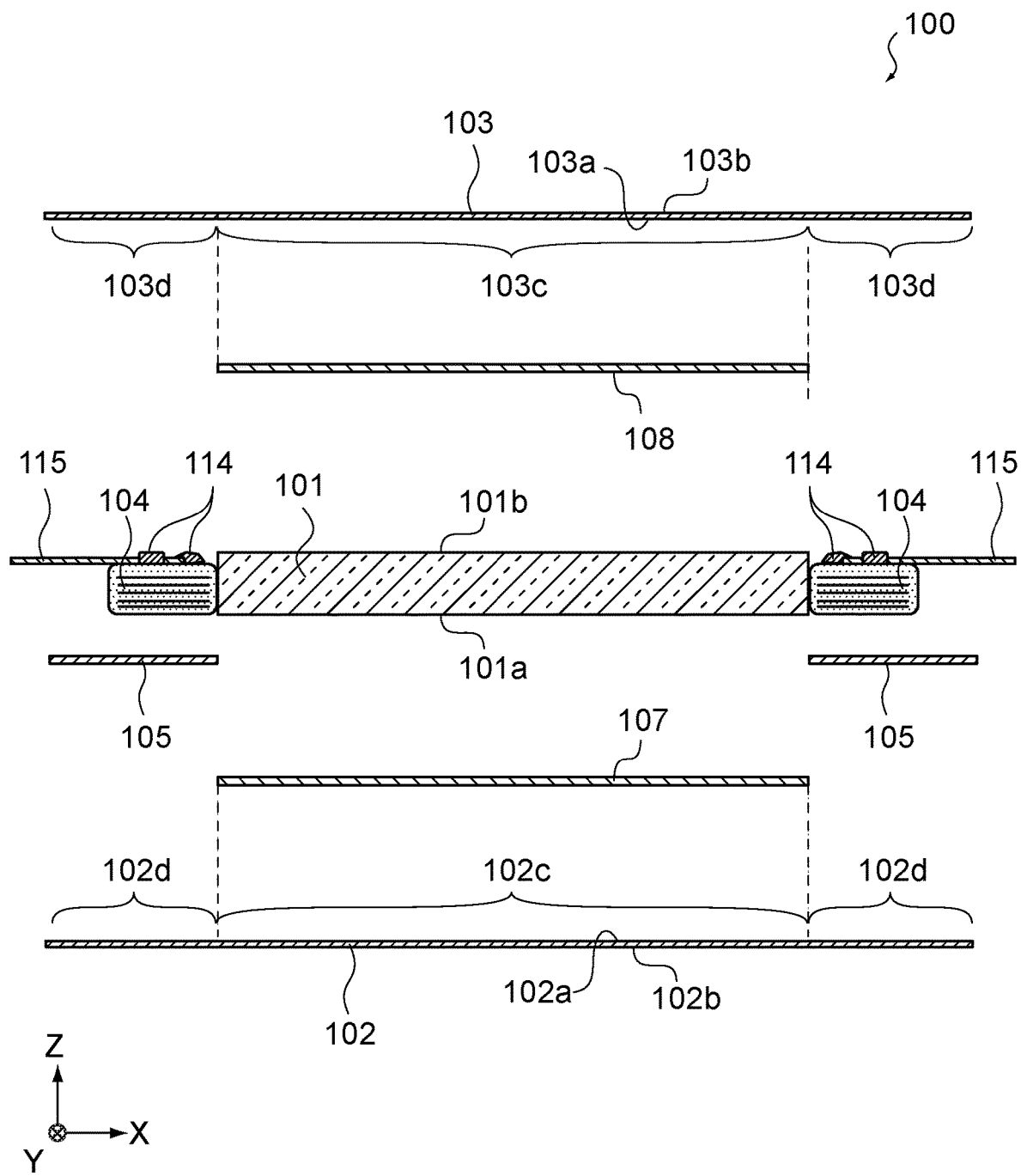
FIG. 4 is an exploded, cross-sectional view of the vibration panel.

FIG. 1 is a perspective view of a vibration panel 100 according to the present embodiment. FIG. 2 is an enlarged, perspective view of the vibration panel 100. FIG. 3 is a cross-sectional view of the vibration panel 100 and is a cross-sectional view taken along the line A-A of FIG. 1. FIG. 4 is an exploded, cross-sectional view showing a configuration of the vibration panel 100 shown in FIG. 3.

In each figure, it is assumed that three directions orthogonal to one another are an X direction, a Y direction, and a Z direction, respectively. The vibration panel 100 has a plate-like shape. It is assumed that the thickness direction of the vibration panel 100 is the Z direction, the long side direction of the vibration panel 100 is the X direction, and the short side direction of the vibration panel 100 is the Y direction.

As shown in FIGS. 1 to 4, the vibration panel 100 includes an inner member 101, a first outer member 102, a second outer member 103, piezoelectric actuators 104, actuator bonding layers 105, fillers 106, a panel bonding layer 107, and a panel bonding layer 108.

The inner member 101 is a plate-like member. The inner member 101 is, for example, a glass plate. As shown in FIG. 4, one main surface of the inner member 101 is a first main surface 101a. A main surface of the inner member 101, which is opposite to the first main surface 101a, is a second main surface 101b. The thickness of the inner member 101 in the Z direction is, for example, 1 mm. The inner member 101 is not limited to the glass plate. The inner member 101 may be a member that incorporates a liquid crystal display module of a liquid crystal display or a touch detection module of a touch panel.

Figure 5:
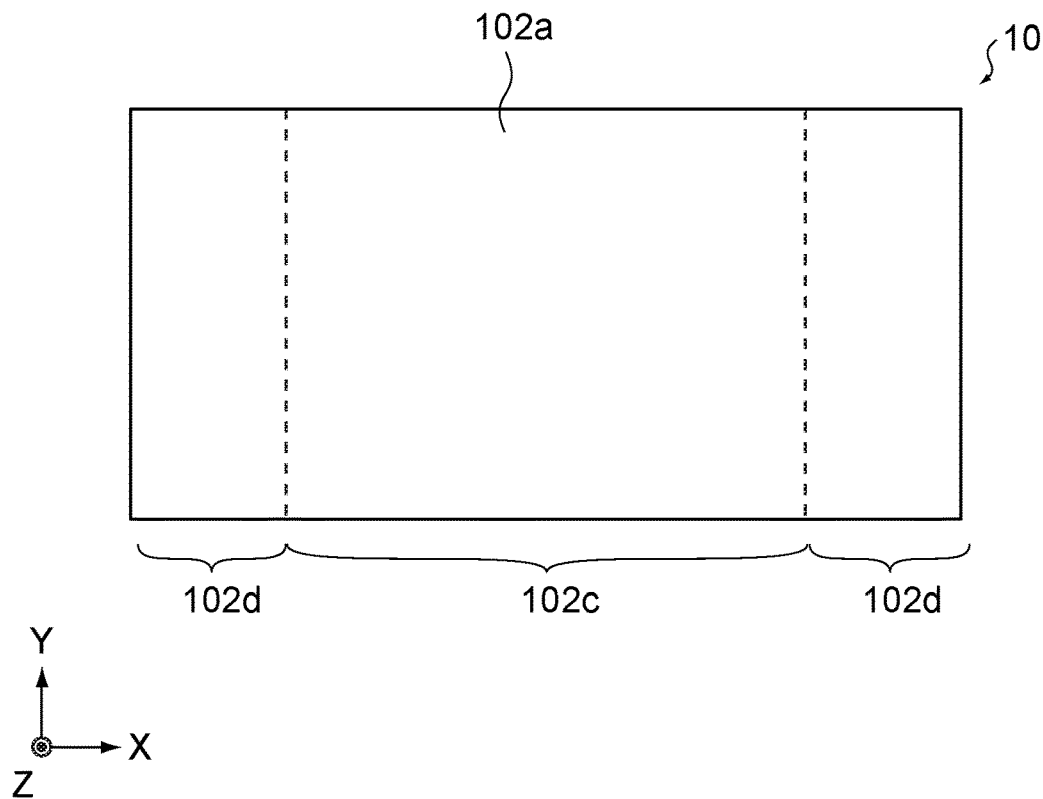
FIG. 5 is a plan view of a first outer member of the vibration panel.

The first outer member 102 is a plate-like member. The first outer member 102 is, for example, a glass plate. FIG. 5 is a plan view of the first outer member 102 as viewed from the inner member 101 side. As shown in FIG. 3, the first outer member 102 is bonded to the first main surface 101a of the inner member 101 through the panel bonding layer 107. As shown in FIG. 4, a main surface of main surfaces of the first outer member 102, which is on the inner member 101 side, is a third main surface 102a. A main surface of the first outer member 102, which is opposite to the third main surface 102a, is a fourth main surface 102b.

The length of the first outer member 102 in the long side direction (X direction) is longer than that of the inner member 101, and the first outer member 102 protrudes from the inner member 101 at both ends in the long side direction. Therefore, only the central portion of the third main surface 102a in the X direction is bonded to the first main surface 101a and both ends of the third main surface 102a in the X direction are not bonded to the first main surface 101a.

Hereinafter, as shown in FIGS. 4 and 5, a region of the third main surface 102a facing the inner member 101 and bonded to the first main surface 101a via the panel bonding layer 107 will be referred to as a first region 102c. Regions protruding from the inner member 101 and not bonded to the inner member 101 will be referred to as second regions 102d. The thickness of the first outer member 102 in the Z direction is, for example, 0.3 mm.

Figure 6:
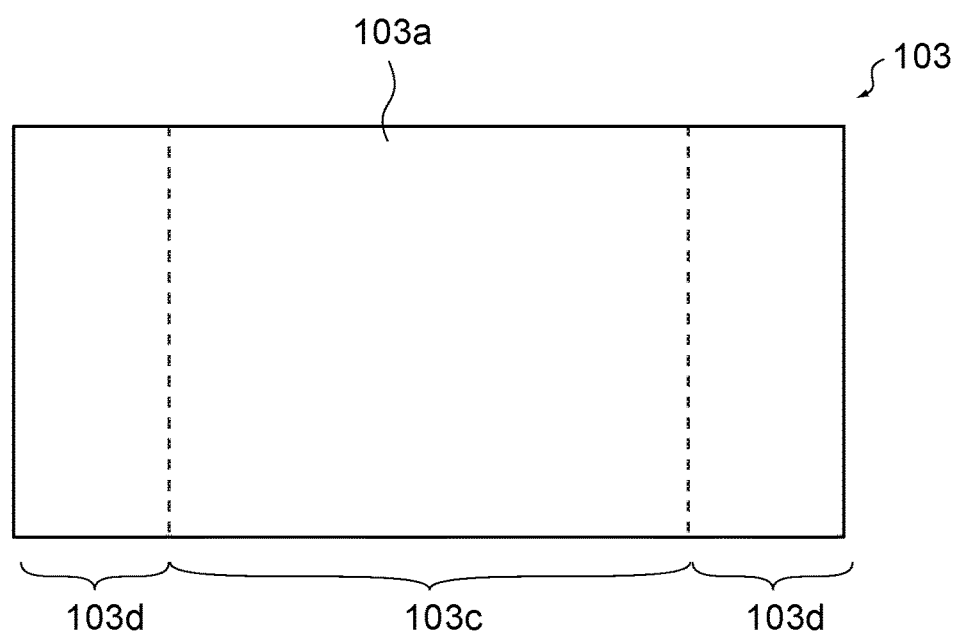
FIG. 6 is a plan view of a second outer member of the vibration panel.

The second outer member 103 is a plate-like member. The second outer member 103 is, for example, a glass plate. FIG. 6 is a plan view of the second outer member 103 as viewed from the inner member 101 side. As shown in FIG. 3, the second outer member 103 is bonded to the second main surface 101b of the inner member 101 through the panel bonding layer 107. As shown in FIG. 4, a main surface of main surfaces of the second outer member 103, which is on the inner member 101 side, is a fifth main surface 103a. A main surface of the second outer member 103, which is opposite to the fifth main surface 102a, is a sixth main surface 103b.

As in the first outer member 102, the length of the second outer member 103 in the long-side direction (X direction) is longer than that of the inner member 101, and the second outer member 103 protrudes from the inner member 101 at both ends in the long-side direction. Therefore, only the central portion of the fifth main surface 102a in the X direction is bonded to the second main surface 101b and both ends of the fifth main surface 102a in the X direction are not bonded to the second main surface 101b.

Hereinafter, as shown in FIGS. 4 and 6, a region of the fifth main surface 103a facing the inner member 101 and bonded to the second main surface 101b will be referred to as a third region 103c. Regions protruding from the inner member 101 and not bonded to the inner member 101 will be referred to as fourth regions 103d. The fourth regions 103d are regions facing the second regions 102d of the first outer member 102. The thickness of the second outer member 103 in the Z direction is, for example, 0.3 mm.

Figure 7:
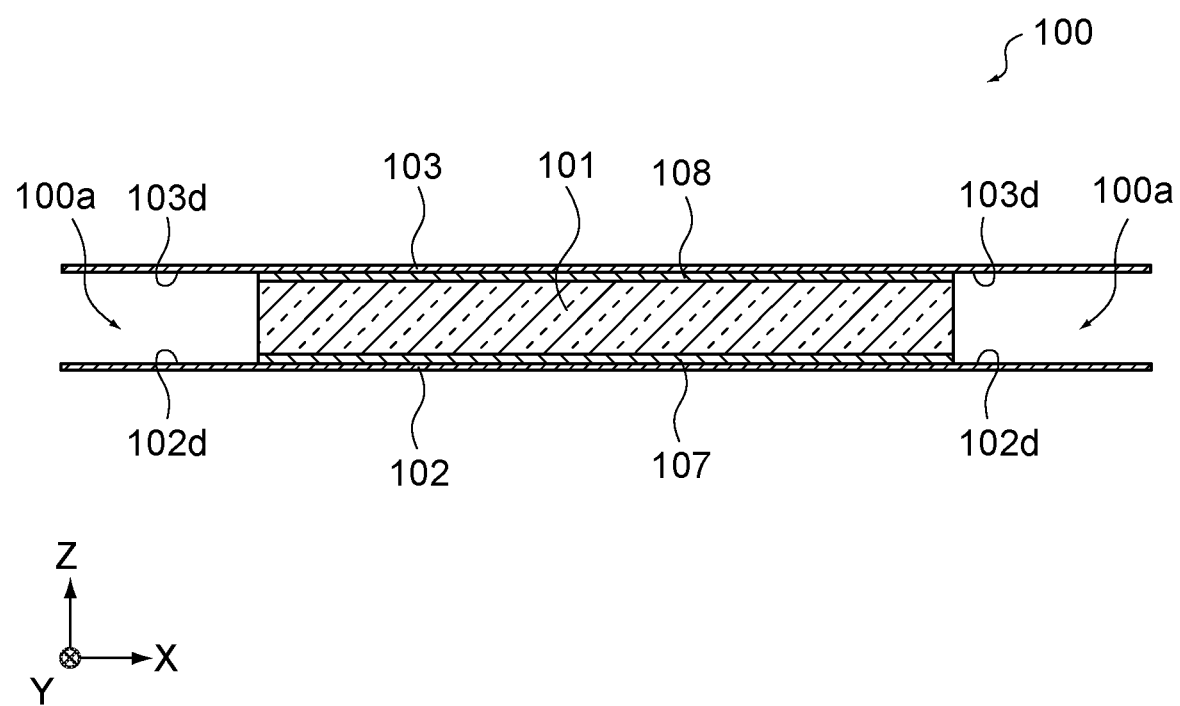
FIG. 7 is a cross-sectional view of a partial configuration of the vibration panel.

FIG. 7 is a cross-sectional view showing a partial configuration of the vibration panel 100. As shown in FIG. 7, there are regions in which the inner member 101 does not exist between the first outer member 102 and the second outer member 103 at both ends in the longitudinal direction (X direction) of the vibration panel 100. Hereinafter, those regions will be referred to as end regions 100a. As described above, the end regions 100a are regions between the second regions 102d of the first outer member 102 and the fourth regions 103d of the second outer member 103.

Figure 8:
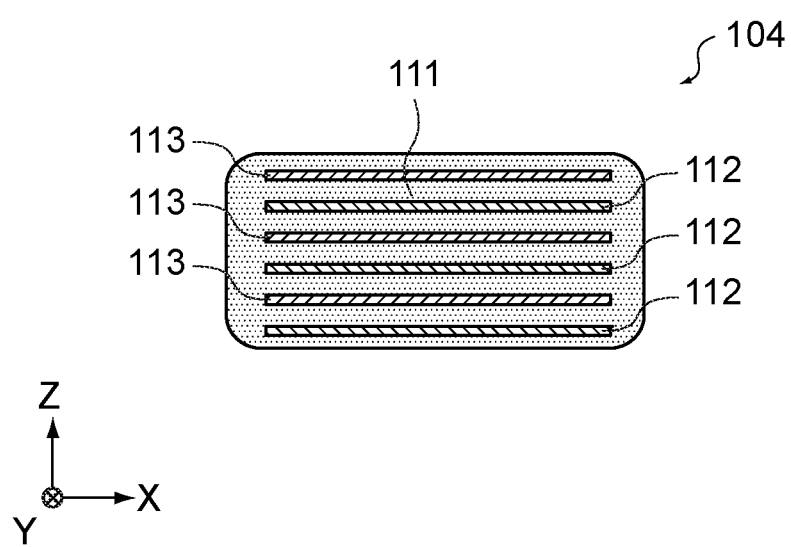
FIG. 8 is a cross-sectional view of a piezoelectric actuator of the vibration panel.

The piezoelectric actuators 104 produce expansion and contraction motion due to the inverse piezoelectric effect. FIG. 8 is a cross-sectional view of the piezoelectric actuators 104. As shown in FIG. 8, the piezoelectric actuators 104 include piezoelectric material layers 111, first inner electrodes 112, and second inner electrodes 113.

The piezoelectric material layers 111 include a piezoelectric material such as lead zirconate titanate (PZT), alkali metal-containing niobium oxide, and bismuth sodium titanate/barium titanate mixed crystal (BNBT). The first inner electrodes 112 and the second inner electrodes 113 include metal such as Ni, Cu, Pd, Pt, Ag, and Au or a conductive material such as an alloy thereof. The first inner electrodes 112 and the second inner electrodes 113 are alternately stacked such that each piezoelectric material layer 111 is sandwiched between each first inner electrode 112 and each second inner electrode 113.

The number of first internal electrodes 112 and the number of second internal electrodes 113 are not particularly limited, and it is sufficient that one or more first internal electrodes 112 and one or more second internal electrodes 113 are provided. The piezoelectric actuators 104 may be sheets including the above-mentioned piezoelectric material laminated with first inner electrodes 112 and second inner electrodes 113 and sintered.

Figure 9:
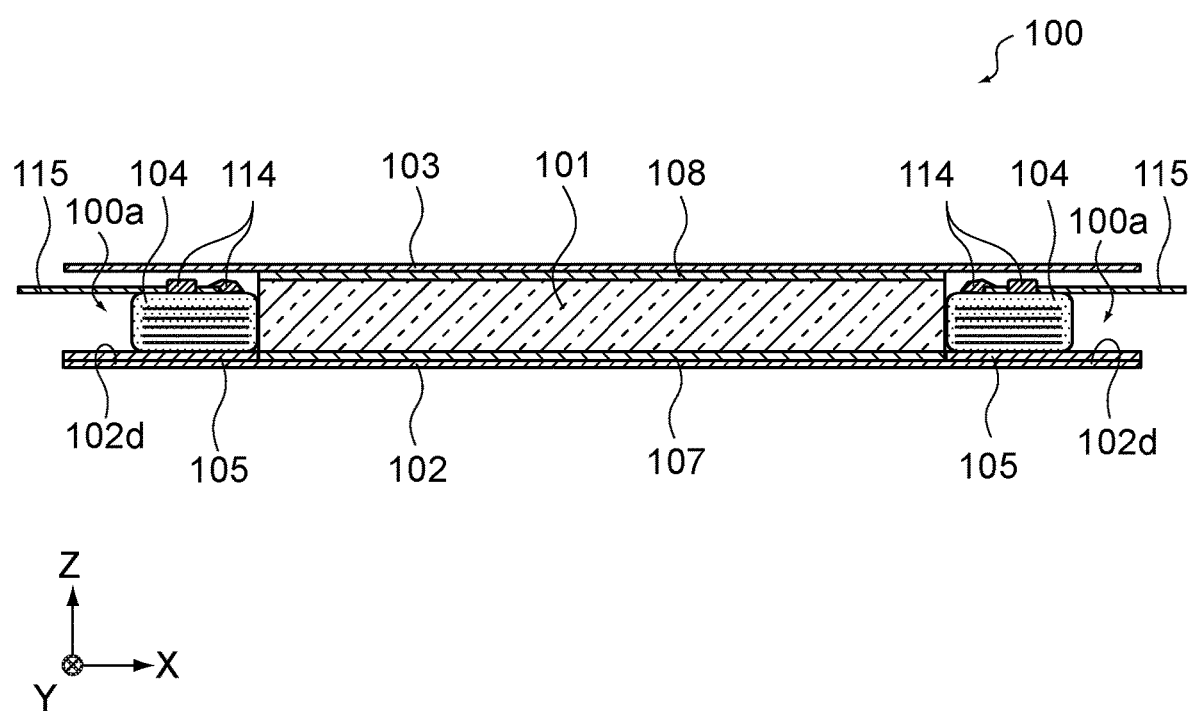
FIG. 9 is a cross-sectional view of a partial configuration of the vibration panel.
Figure 10:
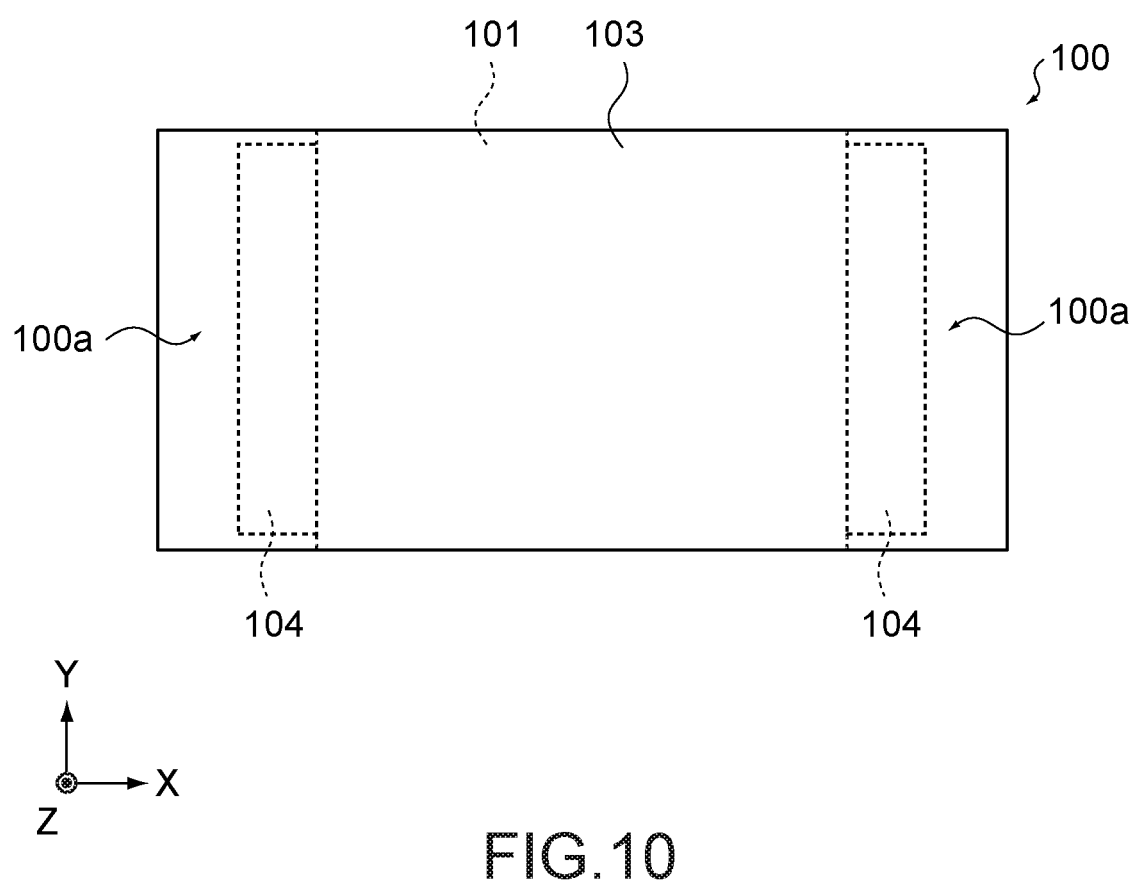
FIG. 10 is a plan view of the vibration panel.

FIG. 9 is a cross-sectional view showing a partial configuration of the vibration panel 100. FIG. 10 is a plan view of the vibration panel 100. As shown in these figures, a single piezoelectric actuator 104 is disposed at each of the two end regions 100a of the vibration panel 100.

As shown in FIG. 9, wires 115 are connected to the piezoelectric actuators 104 via conductive portions 114. The conductive portions 114 include, for example, a copper foil and a conductive paste. The wires 115 are connected to the first inner electrodes 112 and the second inner electrodes 113, respectively, and are capable of applying a voltage between the first inner electrodes 112 and the second inner electrodes 113.

When a current is applied between the first inner electrodes 112 and the second inner electrodes 113, the piezoelectric material layers 111 are deformed due to the inverse piezoelectric effect, causing expansion and contraction motion in the piezoelectric actuators 104. The piezoelectric actuators 104 may be of a bimorph type or a unimorph type. In addition, the configuration of the piezoelectric actuator 104 is not limited to that shown here and only need to cause vibration due to the inverse piezoelectric effect.

As shown in FIG. 2, the actuator bonding layers 105 are disposed between the piezoelectric actuators 104 and the second regions 102d and bond the piezoelectric actuators 104 to the second regions 102d. The material of the actuator bonding layers 105 will be described later.

The fillers 106 are formed by filling the peripheries of the piezoelectric actuators 104 in the end regions 100a. The fillers 106 cover the piezoelectric actuators 104. The fillers 106 bond the piezoelectric actuators 104 and the first outer member 102 and the second outer member 103 to each other. The material of the fillers 106 will be described later.

As shown in FIG. 2, the panel bonding layer 107 is disposed between the inner member 101 and the first outer member 102. The panel bonding layer 107 bonds the inner member 101 to the first outer member 102. As shown in FIG. 2, the panel bonding layer 108 is disposed between the inner member 101 and the second outer member 103. The panel bonding layer 108 bonds the inner member 101 and the second outer member 103. The panel bonding layer 107 and the panel bonding layer 108 include an adhesive material. The panel bonding layer 107 and the panel bonding layer 108 include, for example, elastomer and a double-sided tape. Mobilon (registered trademark) (thermoplastic polyurethane elastomer) can be used as the elastomer.

The vibration panel 100 has the configuration described above. As described above, when a voltage is applied to the piezoelectric actuators 104, the piezoelectric actuators 104 produce expansion and contraction motion. The piezoelectric actuators 104 are bonded to the first outer member 102 through the actuator bonding layers 105, and the expansion and contraction motion of the piezoelectric actuators 104 change into bending motion. Thus, vibration or sound is generated in the vibration panel 100 and the vibration panel 100 functions as a tactile presentation device or a speaker.

Figure 11:
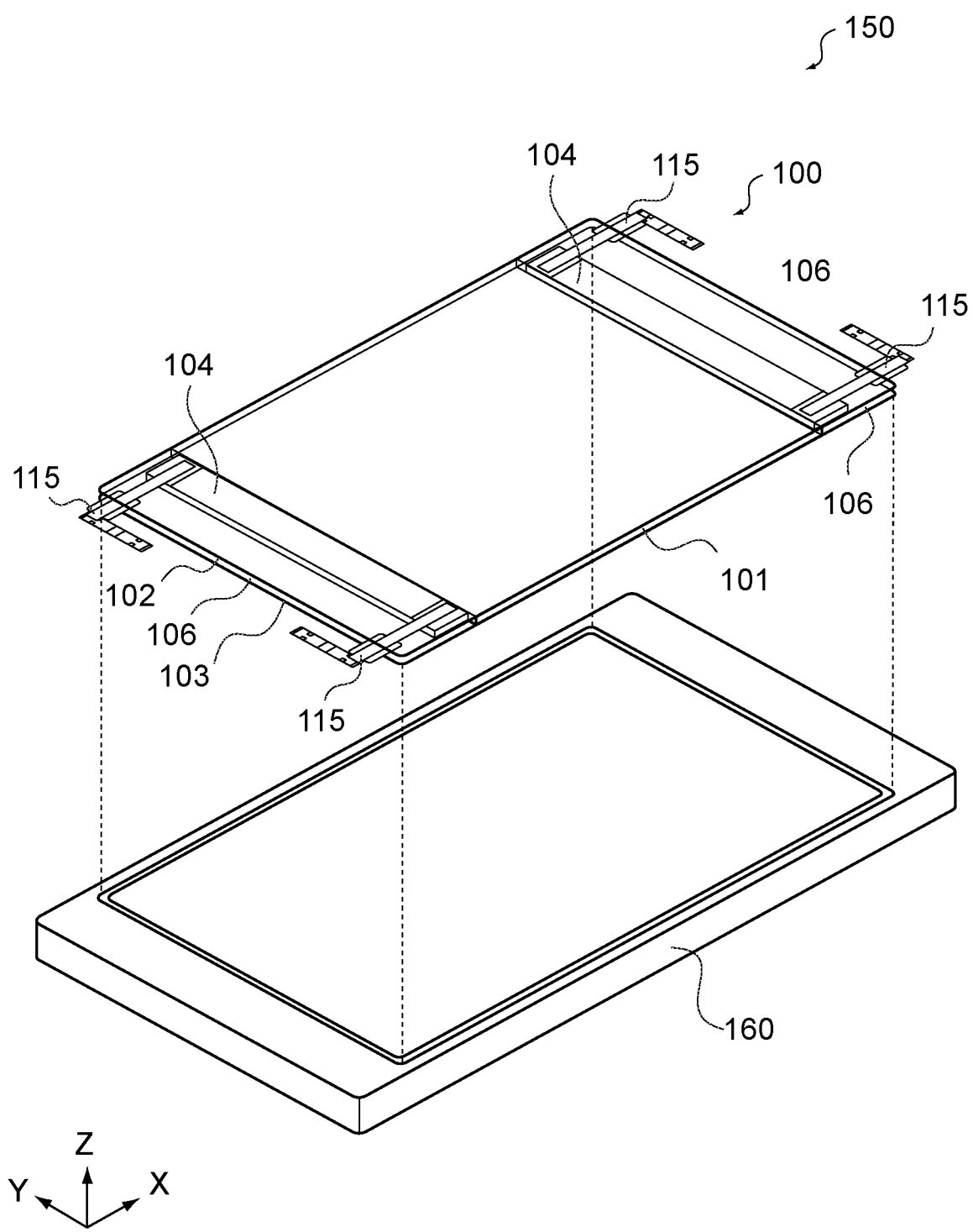
FIG. 11 is a schematic view of an electronic apparatus including the vibration panel.

FIG. 11 is an exploded, perspective view of an electronic apparatus 150 for mounting the vibration panel 100. The electronic apparatus 150 is, for example, a smartphone. The vibration panel 100 can be used as a display for the electronic apparatus 150 by mounting a liquid crystal module and a touch detection module on the inner member 101 and mounting it on a casing 160 as shown in FIG. 11. Alternatively, the vibration panel 100 can be mounted on various electronic apparatuses as a display, a tactile presentation device, and a speaker.

[Regarding Material of Actuator Bonding Layers and Material of Fillers]

In the vibration panel 100, the vibration characteristics can be controlled by using the material of the actuator bonding layers 105 and the material of the fillers 106.

The actuator bonding layers 105 include a resin material. The actuator bonding layers 105 may include, for example, elastomer or epoxy resin. Mobilon (registered trademark) (thermoplastic polyurethane elastomer) can be used as the elastomer.

The fillers 106 include a resin material. The fillers 106 may include, for example, silicon or epoxy resin. The Young's modulus of the material of the fillers 106 may be equal to the Young's modulus of the material of the actuator bonding layers 105. The Young's modulus of the material of the fillers 106 are favorably smaller than the Young's modulus of the material of the actuator bonding layers 105.

FIG. 12 is a table showing the material and Young's modulus of the actuator bonding layers 105 and the material and Young's modulus of the fillers 106. As shown in FIG. 12, the vibration panel 100 in which the actuator bonding layers 105 include an elastomer and the fillers 106 include silicon is defined as "soft fixation". Further, the vibration panel 100 in which the actuator bonding layers 105 include epoxy resin and the fillers 106 include silicon is defined as "medium-hard fixation". In addition, the vibration panel 100 in which the actuator bonding layers 105 include epoxy resin and the fillers 106 also include epoxy resin is defined as "hard fixation".

It should be noted that the Young's modulus shown in FIG. 12 is the Young's modulus of the material of the materials of the actuator bonding layers 105 and the fillers 106, which has a higher Young's modulus.

Figures 13, 14:
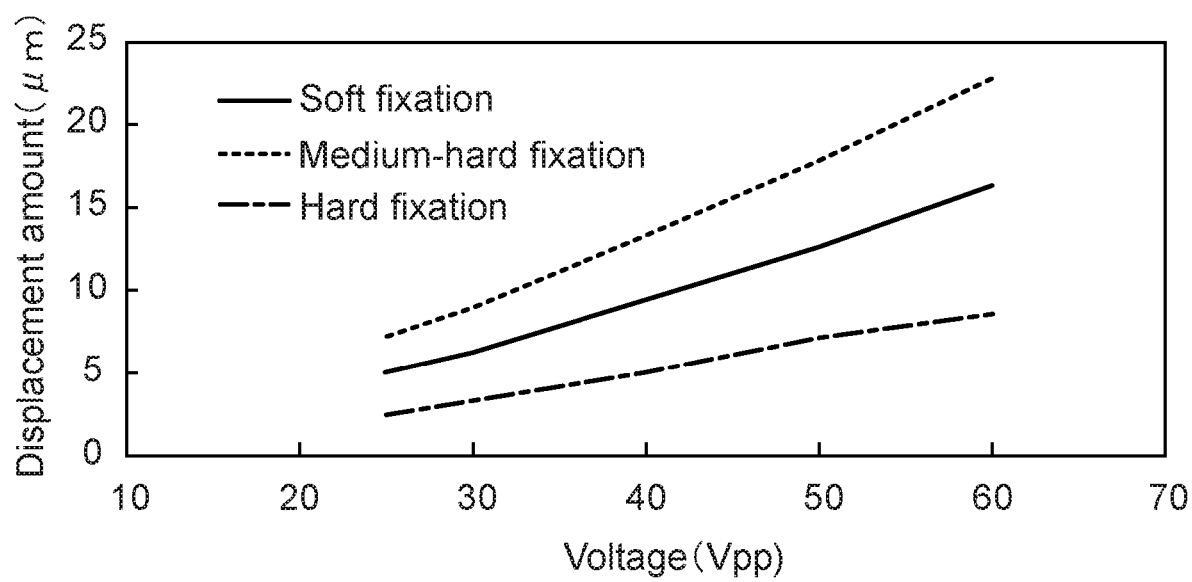
FIG. 13 is a table showing a relationship between the fixation state and the displacement amount in a case where the frequency of the piezoelectric actuator in the vibration panel is 100 Hz.
FIG. 14 is a graph showing a relationship between the fixation state and the displacement amount in a case where the frequency of the piezoelectric actuator in the vibration panel is 100 Hz.

FIG. 13 is a table showing a relationship between the fixation state and the displacement amount (μm) in a case where the frequency of the piezoelectric actuators 104 is 100 Hz. FIG. 14 is a graph thereof. The displacement amount is a displacement amount at the central portion of the first outer member 102.

As shown in FIGS. 13 and 14, in a case where the frequency of the piezoelectric actuators 104 is 100 Hz, the displacement amount at the same voltage is larger in the order of the "medium-hard fixation", the "soft fixation", and the "hard fixation", that is, the vibration panel 100 is more excellent in vibration efficiency in this order.

Figures 15, 16:
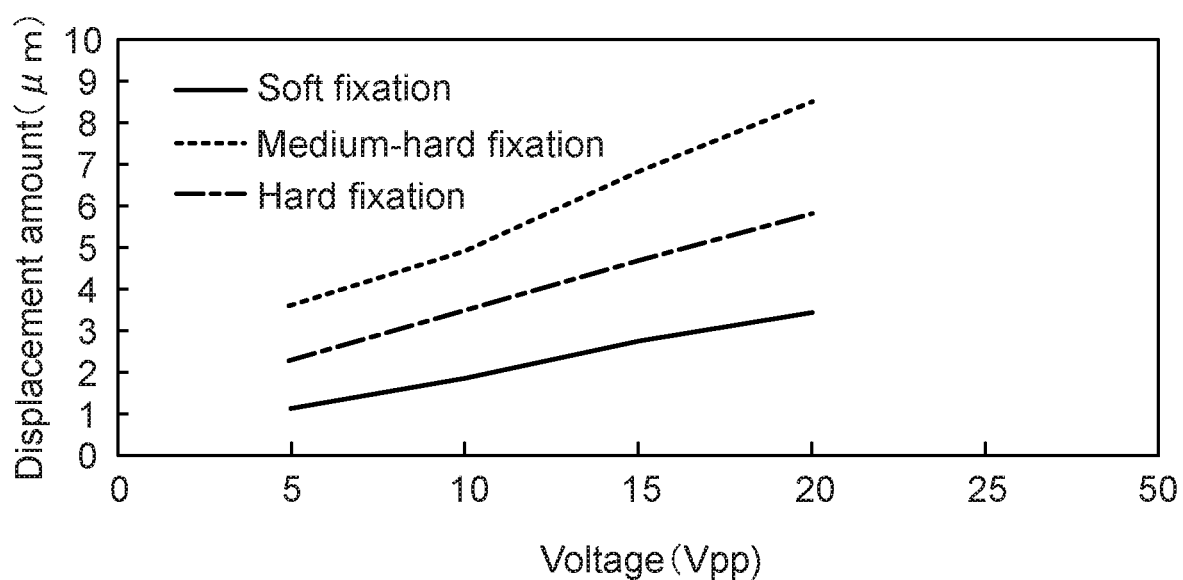
FIG. 15 is a table showing a relationship between the fixation state and the displacement amount in a case where the frequency of the piezoelectric actuator in the vibration panel is 30 Hz.
FIG. 16 is a graph showing a relationship between the fixation state and the displacement amount in a case where the frequency of the piezoelectric actuator in the vibration panel is 30 Hz.

FIG. 15 is a table showing a relationship between the fixation state and the displacement amount (μm) in a case where the frequency of the piezoelectric actuators 104 is 30 kHz. FIG. 16 is a graph thereof. The displacement amount is a displacement amount at the central portion of the first outer member 102.

As shown in FIGS. 15 and 16, in a case where the frequency of the piezoelectric actuators 104 is 30 kHz, the displacement amount at the same voltage is larger in the order of the "medium-hard fixation", the "hard fixation", and the "soft fixation", that is, the vibration panel 100 is more excellent in vibration efficiency in this order.

Thus, the vibration efficiency of the vibration panel 100 can be adjusted in a manner that depends on a desired frequency by using the material of the actuator bonding layers 105 and the material of the fillers 106. In particular in the "medium hardness fixation", higher vibration efficiency can be achieved at both the low and high frequencies.

[Effects of Vibration Panel]

As described above, in the vibration panel 100, the vibration characteristics can be controlled by selecting the material of the actuator bonding layers 105 and the material of the fillers 106 in a manner that depends on a desired frequency.

Further, since the peripheries of the piezoelectric actuators 104 are filled with the fillers 106, the piezoelectric actuators 104 is shielded from the air. For this reason, it is possible to prevent a decrease in IR due to humidity and a load on the electrical connection portion, and it is possible to alleviate a dropping shock. Thus, the reliability of the vibration panel 100 can be increased.

In addition, since the respective configurations such as the piezoelectric actuators 104 are disposed between the first outer member 102 and the second outer member 103, both the front and back surfaces of the vibration panel 100 are flat. As a result, it is easy to bond a substrate or the like thereto. Therefore, the vibration panel 100 is excellent in mountability to an electronic apparatus or the like.

MODIFIED EXAMPLES

While the embodiment of the present disclosure has been described, the present disclosure is not limited to the embodiment described above, and it should be appreciated that the present disclosure may be variously modified.

In the above embodiment, the vibration panel 100 includes the two piezoelectric actuators 104 at the both ends in the long side direction (X direction). Alternatively, the vibration panel 100 may include only one piezoelectric actuators 104. In addition, the shape of the vibration panel 100 is not limited to the rectangular shape, and the vibration panel 100 may be circular or the like.

What is claimed is:

1. A vibration panel, comprising:
    an inner member having a plate-like shape, the inner member including a first main surface and a second main surface opposite to the first main surface;
    a first outer member having a plate-like shape, the first outer member including a third main surface on a side of the inner member and a fourth main surface opposite to the third main surface, the third main surface including a first region and a second region, the first region facing the inner member and being bonded to the first main surface, the second region protruding from the inner member and being not bonded to the inner member;
    a second outer member having a plate-like shape, the second outer member including a fifth main surface on a side of the inner member and a sixth main surface opposite to the fifth main surface, the fifth main surface including a third region and a fourth region, the third region facing the inner member and being bonded to the second main surface, the fourth region protruding from the inner member, being not bonded to the inner member, and facing the second region;
    a piezoelectric actuator that causes vibration by an inverse piezoelectric effect;
    an actuator bonding layer that is disposed between the piezoelectric actuator and the second region and bonds the piezoelectric actuator to the second region; and
    a filler that fills a space between the second region and the fourth region and covers the piezoelectric actuator.

2. The vibration panel according to claim 1, wherein the actuator bonding layer comprises a first resin material, and
    the filler comprises a second resin material having a Young's modulus smaller than a Young's modulus of the first resin material.

3. The vibration panel according to claim 2, wherein the first resin material is epoxy resin, and
    the second resin material is silicon.

4. The vibration panel according to claim 1, wherein the first outer member and the second outer member comprise glass.

5. An electronic apparatus, comprising
    a vibration panel including
        an inner member having a plate-like shape, the inner member including a first main surface and a second main surface opposite to the first main surface,
        a first outer member having a plate-like shape, the first outer member including a third main surface on a side of the inner member and a fourth main surface opposite to the third main surface, the third main surface including a first region and a second region, the first region facing the inner member and being bonded to the first main surface, the second region protruding from the inner member and being not bonded to the inner member,
        a second outer member having a plate-like shape, the second outer member including a fifth main surface on a side of the inner member and a sixth main surface opposite to the fifth main surface, the fifth main surface including a third region and a fourth region, the third region facing the inner member and being bonded to the second main surface, the fourth region protruding from the inner member, being not bonded to the inner member, and facing the second region,
        a piezoelectric actuator that causes vibration by an inverse piezoelectric effect,
        an actuator bonding layer that is disposed between the piezoelectric actuator and the second region and bonds the piezoelectric actuator to the second region, and
        a filler that fills a space between the second region and the fourth region and covers the piezoelectric actuator.

* * * * *